March 17, 1959 — J. J. B. LAIR — 2,878,399

CRYSTAL SEMICONDUCTOR DEVICE

Filed Nov. 4, 1954

INVENTOR
JULIAN J. B. LAIR
BY Henry Kolin
AGENT 2,878,399

CRYSTAL SEMICONDUCTOR DEVICE

Julien J. B. Lair, Glen Ridge, N. J., assignor to International Telephone and Telegraph Corporation, Nutley, N. J., a corporation of Maryland Application November 4, 1954, Serial No. 466,777

11 Claims. (Cl. 307—88.5)

This invention relates to semiconductor devices and more particularly to improved point-contact crystal rectifiers having a low interelectrode capacitance.

When a nonlinear device such as a vacuum tube diode or a crystal detector is used as a threshold device or limiter, the capacitance between the anode and cathode is generally the most important factor to be considered in the application of such a device to narrow pulses or high frequencies. In this respect the crystal detector is more satisfactory for use than the vacuum tube diode because the capacitance between the electrodes in a crystal detector is many times lower than that in a vacuum tube diode. However, when a crystal diode is used in a threshold circuit with pulses narrower than one microsecond or for high frequencies in excess of approximately one megacycle per second, the capacitance between the electrodes becomes troublesome and serves to limit the efficient utilization of such devices. In view of the increasing tendency toward the employment of electronic devices operating at higher and higher frequencies, this poses a serious problem in the use of such semiconductor devices.

It is an object of the present invention, therefore, to provide a new and improved electrical crystal contact device which avoids the above-mentioned disadvantages of such prior devices.

It is a further object to provide a crystal device having an interelectrode capacitance lower than any such known devices heretofore.

A feature of this invention is the provision of an internal shielding between electrodes in a semiconductor device so as to effectively reduce or minimize interelectrode capacitance.

Further objects of this inveniton and features thereof will become apparent from the following description and the accompanying drawings in which.

Figure 1:
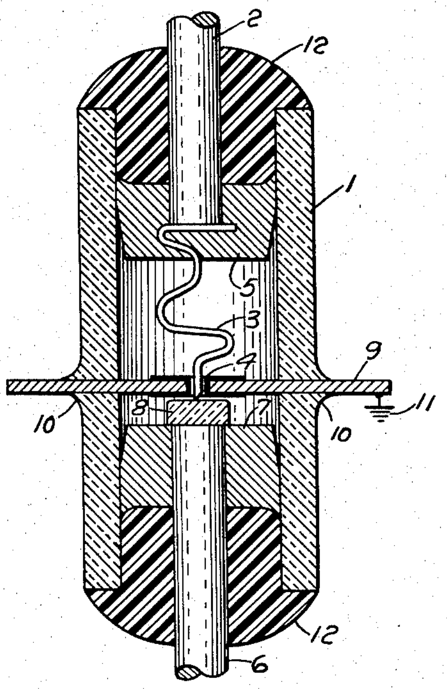
Fig. 1 is a sectional view of a crystal diode illustrating one embodiment of the invention.

Referring to Fig. 1, the diode tubular casing 1 may consist of any rigid insulating material. In general, an unglazed non-porous ceramic tube is preferred for this casing, although other materials such as glass, alumina, titania and various plastics such as polymonochlorotrifluoroethylene and polytetrafluoroethylene may equally well be used. A diode of this type of construction has been described in the copending application of P. E. Lighty, J. Albanes and J. H. Gesell, Serial No. 367,058, filed July 9, 1953. The whisker assembly comprises a conductive support 2, preferably a nickel pin although any similar metallic conductor of the proper degree of rigidity may equally well be used, joined together to an S-shaped point-contact wire 3, preferably made of a platinum or a platinum-ruthenium alloy. Other materials such as tungsten, Phosphor bronze, silver, silver-tin alloy, palladium, gold or copper may also be used; I have found that a wire composed of 90% platinum and 10% ruthenium is suitable for my purpose. Where the whisker wire 3 is held in place upon the semiconductive surface by a filling of dielectric material 4, such as a polyisobutylene gel, for example, the wire need not be S-shaped for purposes of imparting resiliency thereto. The conductive contact member 3 and the conductive lead-in support 2 are held together in rigid relationship to one another by a body of metal 5. In general, the use of metallic lead or various lead alloys is considered satisfactory for this purpose. Such an alloy is particularly suitable for joining the lead-in conductive support 2 and conductive contact member 3 by means of the compression-molding technique.

The crystal assembly comprises a lead-in conductive support 6, preferably of nickel although other conductors may be used as described for the conductive support 2 of the whisker assembly. This support pin 6 is generally comolded with a metal 7 which is readily deformable under pressure. This metal is of the same composition as described for metal 5 of the whisker assembly. To the end of conductive support 6, the semiconductor die or slab 8 is attached. This semiconductor may be composed of germanium, silicon, aluminum-antimony alloy or other similar semiconductive material found to give rectifying action in semiconductor devices. Where germanium is used, for example, the semiconductor is prepared in a well-known manner by reduction in an inert gaseous atmosphere of previously purified germanium dioxide to metallic germanium. During or subsequent to this reduction process, various additives may be incorporated in the germanium to produce desired electrical properties. Where single-crystal germanium is used for the semiconductor, it is apparent that a certain latitude will exist with respect to the specific location of the whisker point on the semiconductor surface without affecting the electrical properties of the assembled crystal diode. The semiconductor 8 may be attached to the conductive support 6 in any of several manners, such as welding, soldering or by use of a conductive cement, for example, a polyethoxyline type cement containing silver or a silver-antimony alloy. Prior to inserting the whisker assembly in the casing, and generally after inserting the crystal assembly, a conductive element 9 in the form of a flat metallic disk and serving as a shield is placed within the casing closely adjacent to the crystal. This disk 9 may be made of any conductive material such as copper, tin-copper, nickel, silver, conductive alloys thereof or the like. For purposes of obtaining the proper spacing, the disk may be set in place making electrical contact with the semiconductive crystal and then the disk or crystal gradually withdrawn to break contact, this being determined by readings taken on appropriate electrical instruments. The casing is provided with orifices 10 so that a portion of the conductive element 9 may extend therethrough. Alternatively, conductive means are employed to make electrical contact to the shield 9, and once contact has been established these leads may be spot welded in place. A small orifice is provided in the conductive element 9 and the whisker wire is passed therethrough. A slow steady pressure is then applied simultaneously to the whisker and crystal assemblies so that they enter the tube uniformly and indicate when the whisker makes electrical contact with the semiconductor die 8. At the same time, electrical instruments indicate whether any contact occurs between the end portion of the whisker wire and the shield 9. To guard against such undesired contact, all but the tip portion of the whisker wire in the region adjacent the semiconductor die may be coated with an insulating material, such as any of several well-known enamels used for this purpose. Similarly, the conductive element 9 may be coated in order to avoid electrical contact with the whisker 3 or the semiconductor 8; or both the whisker 3 and the screen 9 may be coated with such an insulating material. The shield 9 is generally coupled to a given potential 11, such as ground or floating ground, by means of its extension outside of the crystal body. After the metallic plugs 5 and 7 have been force fitted into the ceramic tube under pressure and properly positioned, as shown, both ends of the casing are sealed with measured amounts of a polyethoxyline type cement 12. Terminal or lead wires may then be butt-welded to the end of the conductive supports 2 and 6.

It is also feasible and desirable for certain applications that the conductive screen 9 be connected to a positive or negative direct-current voltage, which may serve to accelerate or decelerate the velocity of the electrons into the crystal. In such a case, it is preferable to bypass the D.-C. voltage source to ground by use of an appropriate condenser in order to obtain full advantage of the shielding effect.

Figure 2:
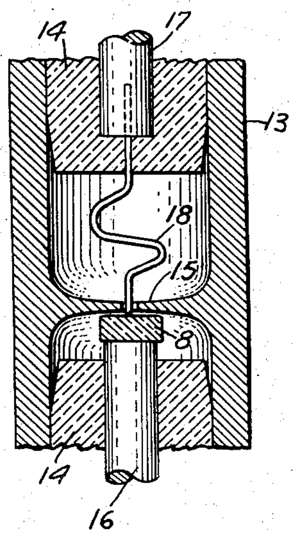
Fig. 2 is a sectional view of another embodiment showing an internally shielded crystal diode having a conducting casing.

In Fig. 2 is shown another embodiment of a crystal diode for practicing the invention. A tubular conductive casing 13 is used, and insulating means 14, such as glass, ceramic, polytetrafluoroethylene, polymonochlorotrifluoroethylene or the like, is used to support the whisker and crystal within the casing. At the region of the crystal-whisker contact, an interior wall portion of the casing is inwardly flared providing a radially inwardly projecting flange 15 closely about but in dielectrically spaced shielding relation to the crystal-whisker contact. Such a device provides not only internal shielding, but in addition allows for a tubular shield about the conductive supports 16 and 17, respectively, supporting semiconductive contact member 8 and conductive contact member 18. The conductive casing may be grounded thereby providing shielding not only about the crystal-whisker contact but about the entire diode structure.

Figure 3:
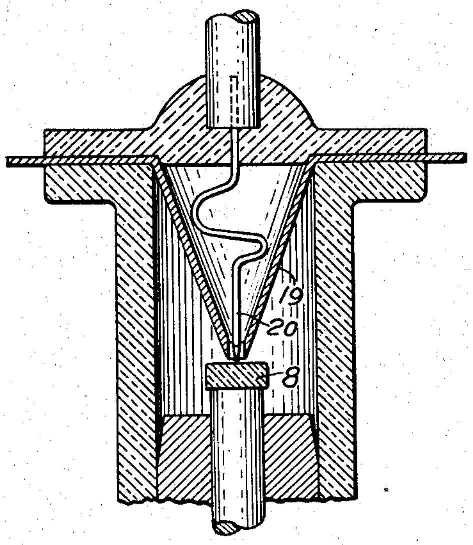
Fig. 3 is a sectional view of still another embodiment in which the shielding element is tapered.

In Fig. 3 the conductive shielding element 19 is conically shaped, the conductive element flaring outwardly in a conical manner from adjacent the region of the crystal-whisker contact. A hole is provided at the narrow opening of the cone so as to allow the whisker 20 to extent therethrough and touch the crystal 8. The cone may be used to maintain the whisker in place, or any suitable wax, glue, or plastic material may be employed in the usual manner to maintain the whisker 20 in place. As previously mentioned, the whisker 20 or the conical shield 19 or both can be coated with an insulating material, except for the actual contact region between the whisker and the crystal.

Figure 4:
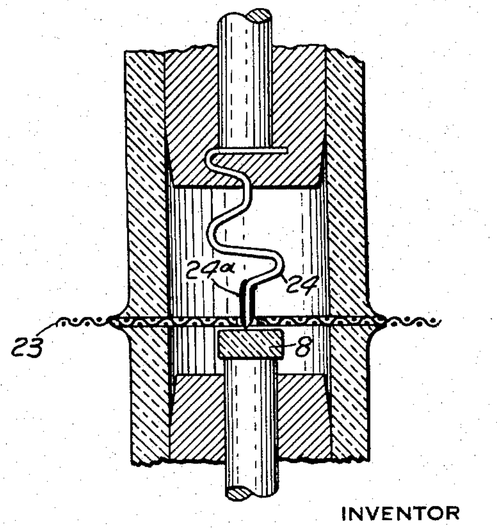
Fig. 4 is a sectional view of still another embodiment in which the shielding element is foraminous.

In Fig. 4 the conductive element 23 includes a foraminous section through which a conductive contact member 24 extends. If the screen 23 is made of bare wires, the whisker 24 would preferably be insulated as indicated by coating 24*a* except for its contact point to the crystal. The apertures in the screen should preferably be of the same diameter as the coated whisker 24, or perhaps slightly smaller, in order that the whisker be maintained in place by the screen.

It will be readily apparent from the descriptions of the several figures contained herein that many other embodiments are possible without departing from the principal idea of the invention, which consists of incorporating a built-in shield within a semiconductive device so as to reduce the capacitive coupling between the semiconductive and conductive contact members. For optimum results, this reduction is interelectrode capacitance is achieved by having the shield extend as close as possible to the point of contact between the whisker and the crystal. As small an aperture as feasible is then provided in the center of the shield as shown in the various embodiments described herein. Where the shield is extended outside of the crystal body of the rectifier, one can readily obtain a continuous shield by connecting the outside shield to still an additional external shield which forms part of the whole circuitry. Connection is made to the internal shield so that it is maintained at the proper potential for desired circuit applications. While in most cases the shield will be maintained at ground or circuit floating potential, for certain applications a negative or positive D.-C. voltage may be applied.

The total capacitance across the crystal is due principally to the capacitance between the input and output leads. The capacitance between the whisker and crystal is small compared to this capacitance between the leads. This becomes an important problem in typical threshold circuits such as are used in devices such as coders, computers, compandors, pulse modulation systems, electronic switches and the like. Heretofore, it has been found that when a pulse of amplitude $V_p$ is applied through a terminal A at the anode of a crystal detector which is biased on the cathode by a voltage $V_A$ through a load resistance R, the voltage $V_A$ blocks the crystal for any voltage equal to or lower than $V_A$ applied to terminal A. The output signal at terminal B, the cathode, is equal to $V_p - V_A$ for $V_p \geqq V_A$ and equal to zero for $V_p \leqq V_A$. However, owing to the capacitance of the crystal diode, a signal appears at the output terminal. Even for $V_p < V_A$ and even for a small value of R, a zero output exists only during a small interval. In order to remove the undesired signal, it is usually necessary to sample the output signal at high peak levels. However, according to this invention this supplementary sampling can be completely avoided even for pulses of 0.1 microsecond duration.

While I have described above the principles of my invention in connection with specific apparatus, it is to be clearly understood that this description is made only by way of example and not as a limitation to the scope of my invention as set forth in the objects thereof and in the accompanying claims.

I claim:

1. A point-contact semiconductive device comprising a pair of conductive supports, having an interelectrode capacitance therebetween, semiconductive and conductive contact members disposed by said supports in point-contact engagement, and a conductive element surrounding in close spaced shielding relation said conductive contact member at the region of said point-contact engagement to reduce said interelectrode capacitance.

2. A device according to claim 1 in which said semiconductive member includes a semiconductive germanium crystal.

3. A device according to claim 1 in which said semiconductive member includes a semiconductive silicon crystal.

4. A device according to claim 1 in which said conductive element includes a foraminous section through which said conductive contact member extends.

5. A point-contact semiconductive device comprising a pair of conductive supports, semiconductive and conductive contact members disposed by said supports in point-contact engagement, a conductive element surrounding in close spaced relation said conductive contact member at the region of said point-contact engagement, and a dielectric material surrounding said conductive contact member to maintain it in close spaced insulating relation to said conductive element at the region of said point-contact engagement.

6. A point-contact semiconductive device comprising a pair of conductive supports having an interelectrode capacitance therebetween, semiconductive and conductive contact members disposed by said supports in point-contact engagement, a conductive element surrounding in close spaced shielding relation said conductive contact member at the region of said point-contact engagement, and means coupling a reference potential to said conductive element to reduce said interelectrode capacitance.

7. A point-contact semiconductive device comprising a whisker assembly including a lead-in conductor and whisker, a crystal assembly including a lead-in conductor and semiconductor crystal, a tubular insulating casing, means supporting said whisker and crystal within said casing with said whisker in contact with said crystal, and a conductive element disposed within said casing adjacent said crystal and whisker and surrounding said whisker in dielectrically spaced relation thereto in the region of said crystal-whisker contact, said conductive element having a part extending through the walls of said casing to which a given potential may be applied.

8. A point-contact semiconductive device comprising a whisker assembly including a lead-in conductor and whisker, a crystal assembly including a lead-in conductor and semiconductive crystal, a tubular conductive casing, means supporting said whisker and crystal within said casing with said whisker in contact with said crystal, an interior wall portion of said casing flaring inwardly adjacent said crystal and whisker and surrounding said whisker in dielectrically spaced relation in the region of said crystal-whisker contact.

9. A point-contact semiconductive device comprising a whisker assembly including a lead-in conductor and whisker, a crystal assembly including a lead-in conductor and semiconductive crystal, a tubular insulating casing, means supporting said whisker and crystal within said casing with said whisker in contact with said crystal, and a conductive element within said casing adjacent said crystal and whisker, said conductive element flaring outwardly conically from adjacent the region of said crystal-whisker contact.

10. In a crystal contact in which a semiconductive crystal constitutes one contact element and in which the other contact element constitutes the end of a metal wire disposed in contact with said crystal, a conductive element disposed adjacent said crystal contact and electrically insulated therefrom and surrounding in close dielectrically spaced shielding relation the end portion of said wire contacting said crystal.

11. In a crystal contact in which a semiconductive crystal constitutes one contact element and in which the other contact element constitutes the end of a metal wire disposed in contact with said crystal, a conductive element disposed adjacent said crystal contact and surrounding in close dielectrically spaced shielding relation the end portion of said wire contacting said crystal, and means coupling a reference potential to said conductive element.

References Cited in the file of this patent

UNITED STATES PATENTS

| | | |
|---|---|---|
| 2,610,234 | Dickson | Sept. 9, 1952 |
| 2,629,767 | Nelson et al. | Feb. 24, 1953 |
| 2,713,132 | Mathews et al. | July 12, 1955 |